United States Patent
Tseng

(10) Patent No.: US 7,778,093 B2
(45) Date of Patent: Aug. 17, 2010

(54) MEMORY CONTROL CIRCUIT CAPABLE OF DYNAMICALLY ADJUSTING DEGLITCH WINDOWS, AND RELATED METHOD

(75) Inventor: Jui-Hsing Tseng, Hsinchu County (TW)

(73) Assignee: Mediatek Inc., Science-Based Industrial Park, Hsin-Chu (TW)

(*) Notice: Subject to any disclaimer, the term of this patent is extended or adjusted under 35 U.S.C. 154(b) by 610 days.

(21) Appl. No.: 11/835,423

(22) Filed: Aug. 8, 2007

(65) Prior Publication Data

US 2009/0043981 A1 Feb. 12, 2009

(51) Int. Cl.
*G11C 7/00* (2006.01)
(52) U.S. Cl. .............. 365/193; 365/191; 365/194; 365/233.13
(58) Field of Classification Search .............. 365/191, 365/193, 194, 233.11, 233.13
See application file for complete search history.

(56) References Cited

U.S. PATENT DOCUMENTS 5,948,083 A * 9/1999 Gervasi ................ 710/62
6,819,157 B2 * 11/2004 Cao et al. .............. 327/262
7,076,678 B2 * 7/2006 LaBerge ............... 713/401
7,177,379 B1 * 2/2007 Shihadeh et al. ........ 375/354
2009/0043953 A1 * 2/2009 Tseng .................. 711/105

* cited by examiner

*Primary Examiner*—Dang T Nguyen
*Assistant Examiner*—Alexander Sofocleous
(74) *Attorney, Agent, or Firm*—Winston Hsu

(57) ABSTRACT

A memory control method for adjusting deglitch windows utilized by a memory control circuit receiving an original data strobe signal of a memory includes: deglitching according to the original data strobe signal by utilizing a plurality of deglitch windows that are set by delaying an original deglitch window signal in order to derive a plurality of deglitch results, where the deglitch windows have different beginning time points; and utilizing the deglitch results to dynamically determine a delay amount for delaying the original deglitch window signal, where the beginning time point of one of the deglitch windows is kept centered at a middle time point of a preamble of the original data strobe signal.

20 Claims, 7 Drawing Sheets

US 7,778,093 B2

MEMORY CONTROL CIRCUIT CAPABLE OF DYNAMICALLY ADJUSTING DEGLITCH WINDOWS, AND RELATED METHOD

BACKGROUND

The present invention relates to memory control, and more particularly, to memory control circuits capable of dynamically adjusting deglitch windows, and related methods.

According to the related art, a manufacturer of an electronic device comprising a memory control circuit typically provides a plurality of operation modes for the electronic device, and more particularly, for the memory control circuit. Different operation modes may introduce respective values of power consumption, so various levels of supply voltage drops of the memory control circuit may occur while switching between the operation modes, causing a data strobe signal such as a DQS signal to be very noisy. Regarding this problem, within the memory control circuit, a deglitch window is typically utilized for gating the noisy data strobe signal, before a preamble of the data strobe signal and after a postamble of the data strobe signal.

In a mass production phase of the electronic device, the manufacturer typically needs to determine a fixed delay amount for delaying a deglitch window signal so the deglitch window may be setup, in order to achieve better performance of memory control. When the electronic device is sold to a reseller or an end user, the fixed delay amount will no longer be changed.

However, the phases of the deglitch window signal and/or the DQS signal may fluctuate due to interference from noise or internal/external environmental reasons such as temperature variation or the supply voltage drops mentioned above. Therefore, it is not possible for the electronic device, and more specifically, for the memory control circuit to achieve the best performance of memory control by utilizing the fixed delay amount.

SUMMARY

It is an objective of the claimed invention to provide memory control circuits and methods to solve the above-mentioned problem.

It is another objective of the claimed invention to provide memory control circuits and methods in order to dynamically adjust deglitch windows.

It is another objective of the claimed invention to provide memory control circuits and methods in order to achieve the best performance of memory control by utilizing dynamically adjusted deglitch windows.

An exemplary embodiment of a memory control circuit receiving an original data strobe signal of a memory comprises: a setting circuit for setting at least three deglitch windows respectively having different beginning time points; a deglitch circuit, coupled to the setting circuit, for deglitching according to the original data strobe signal by utilizing the at least three deglitch windows to derive at least three deglitch results; and a determining circuit, coupled to the deglitch circuit and the setting circuit, for determining a latest value of a span period between the at least three deglitch windows set by the setting circuit according to the at least three deglitch results, in order to adjust the span period of the at least three deglitch windows. According to the original data strobe signal, the deglitch circuit utilizes one of the at least three deglitch windows to generate a deglitched data strobe signal for accessing the memory.

An exemplary embodiment of a memory control method for adjusting deglitch windows utilized by a memory control circuit receiving an original data strobe signal of a memory comprises: deglitching according to the original data strobe signal by utilizing a plurality of deglitch windows that are set by delaying an original deglitch window signal, in order to derive a plurality of deglitch results, where the deglitch windows have different beginning time points; and utilizing the deglitch results to dynamically determine a delay amount for delaying the original deglitch window signal, where the beginning time point of one of the deglitch windows is kept centered at a middle time point of a preamble of the original data strobe signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
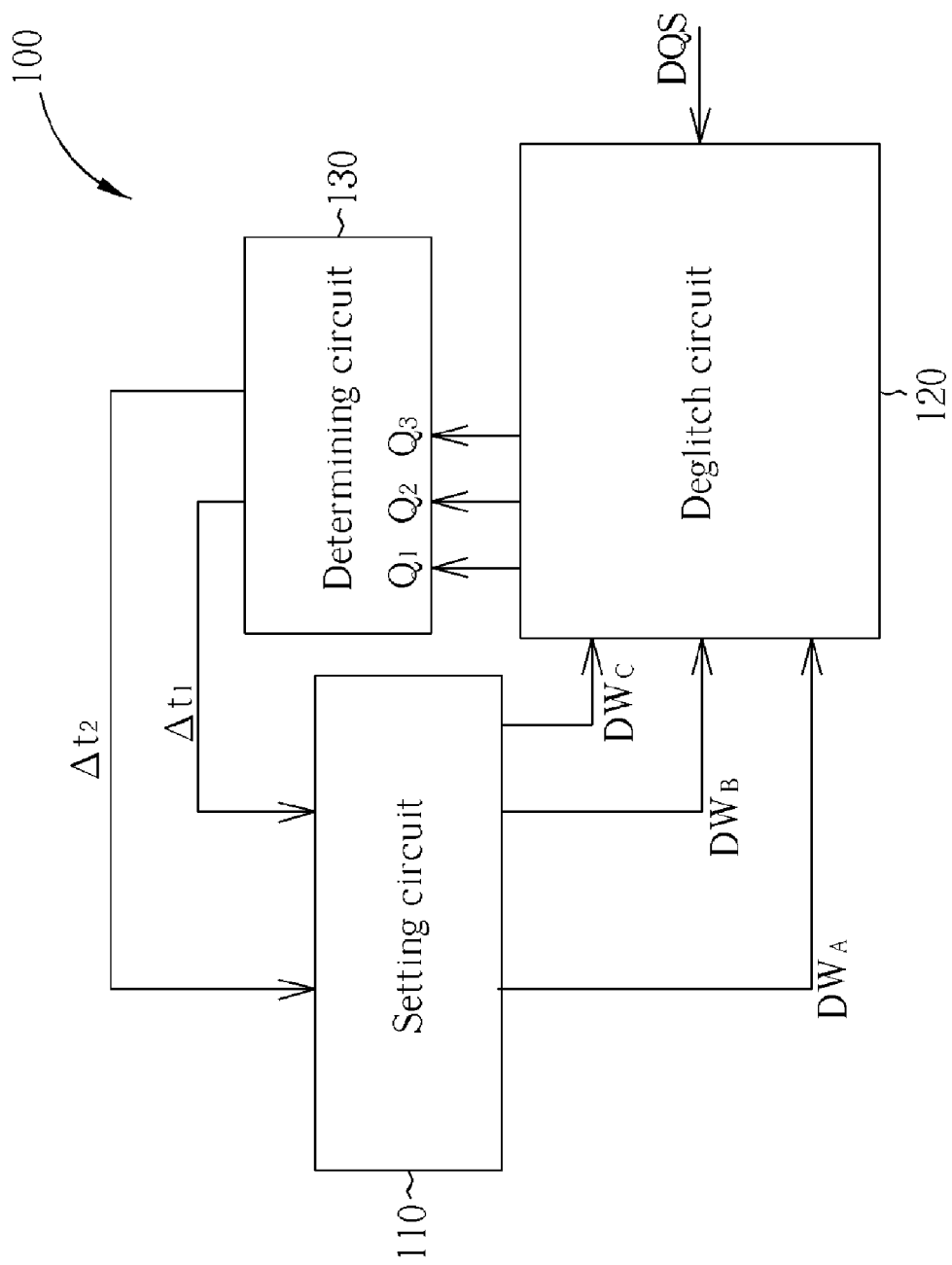
FIG. 1 is a block diagram of a memory control circuit according to a first embodiment of the present invention.

Please refer to FIG. 1. FIG. 1 is a block diagram of a memory control circuit 100 according to a first embodiment of the present invention. In this embodiment the memory control circuit 100 comprises a setting circuit 110, a deglitch circuit 120, and a determining circuit 130, and receives an original data strobe signal of a memory such as a double data rate (DDR) memory, where the original data strobe signal of this embodiment is a DQS signal.

Figure 2:
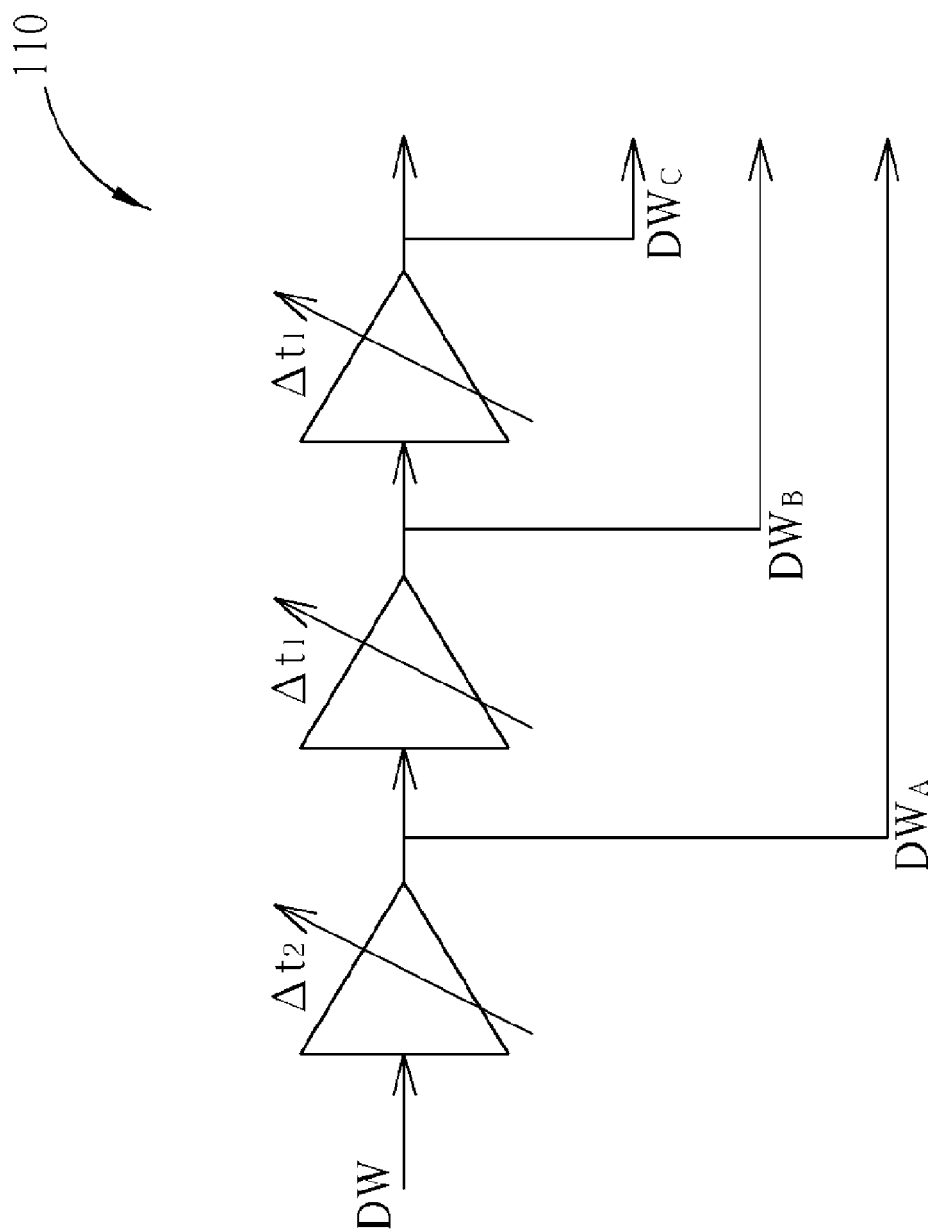
FIG. 2 is a block diagram of the setting circuit shown in FIG. 1 according to the first embodiment.
Figure 3:
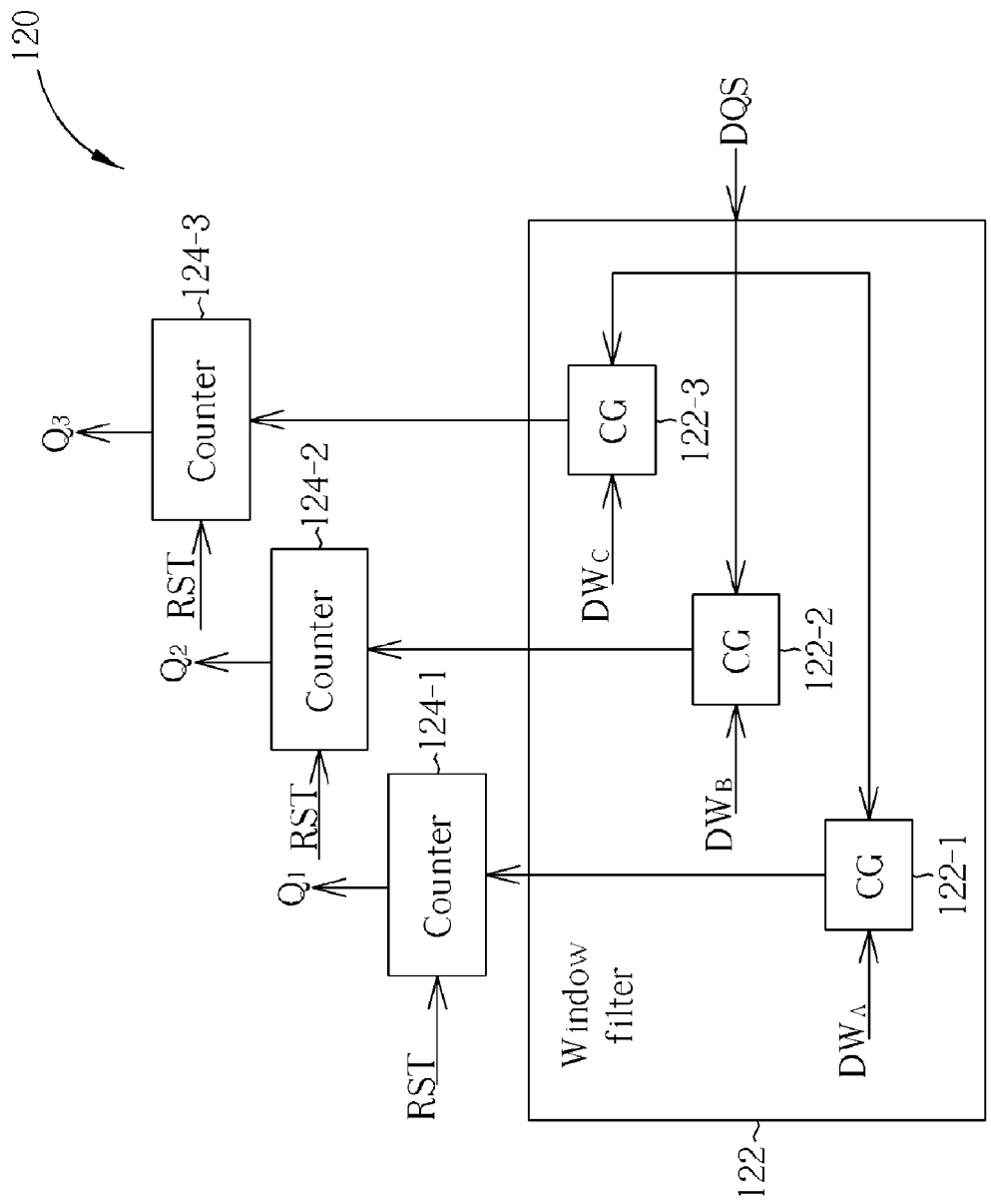
FIG. 3 is a block diagram of the deglitch circuit shown in FIG. 1 according to the first embodiment.
Figure 4:
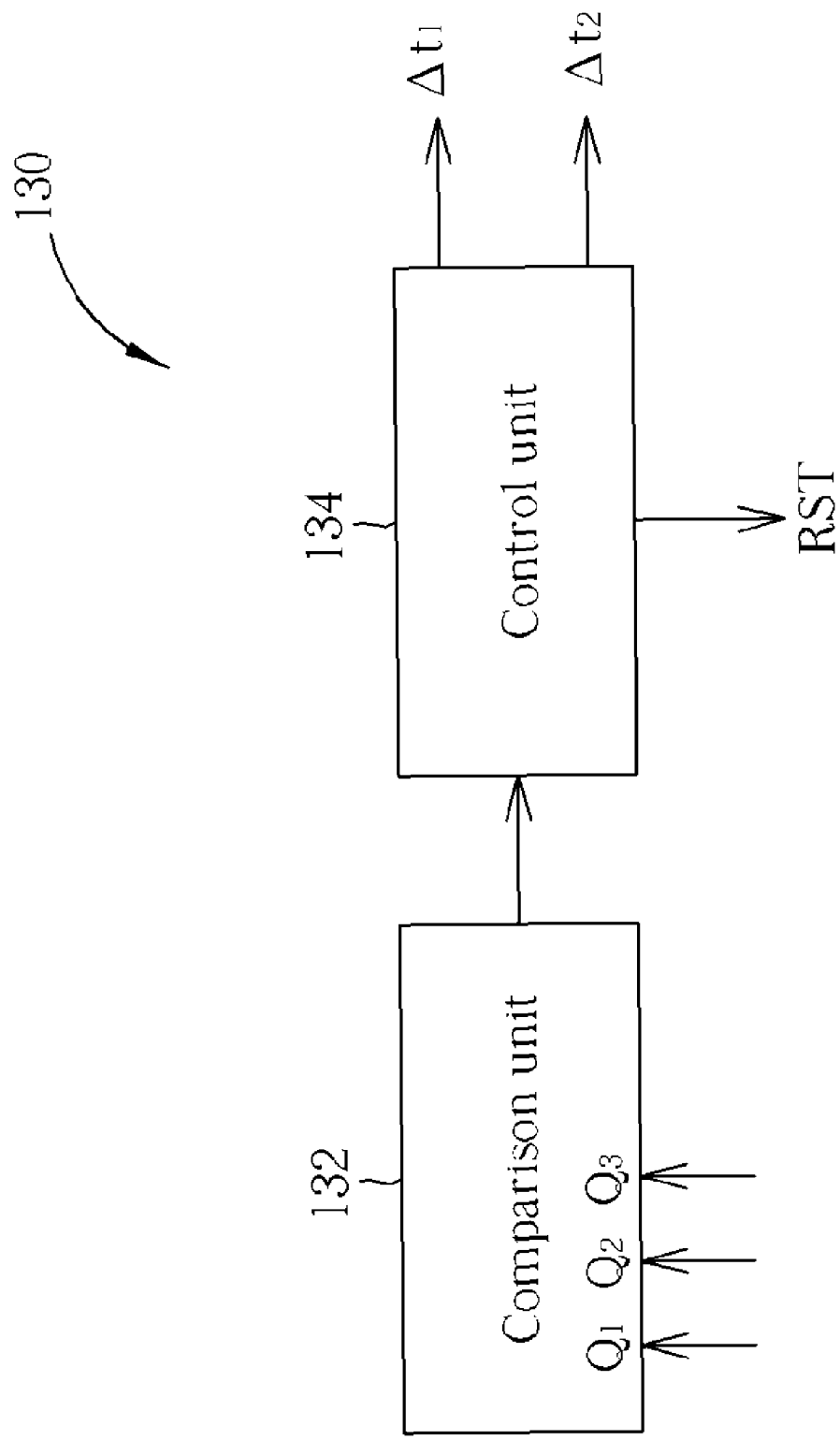
FIG. 4 is a block diagram of the determining circuit shown in FIG. 1 according to the first embodiment.

According to the first embodiment, some implementation details such as those of the setting circuit 110, the deglitch circuit 120, and the determining circuit 130 shown in FIG. 1 are further illustrated as shown in FIG. 2, FIG. 3, and FIG. 4.

Figure 5:
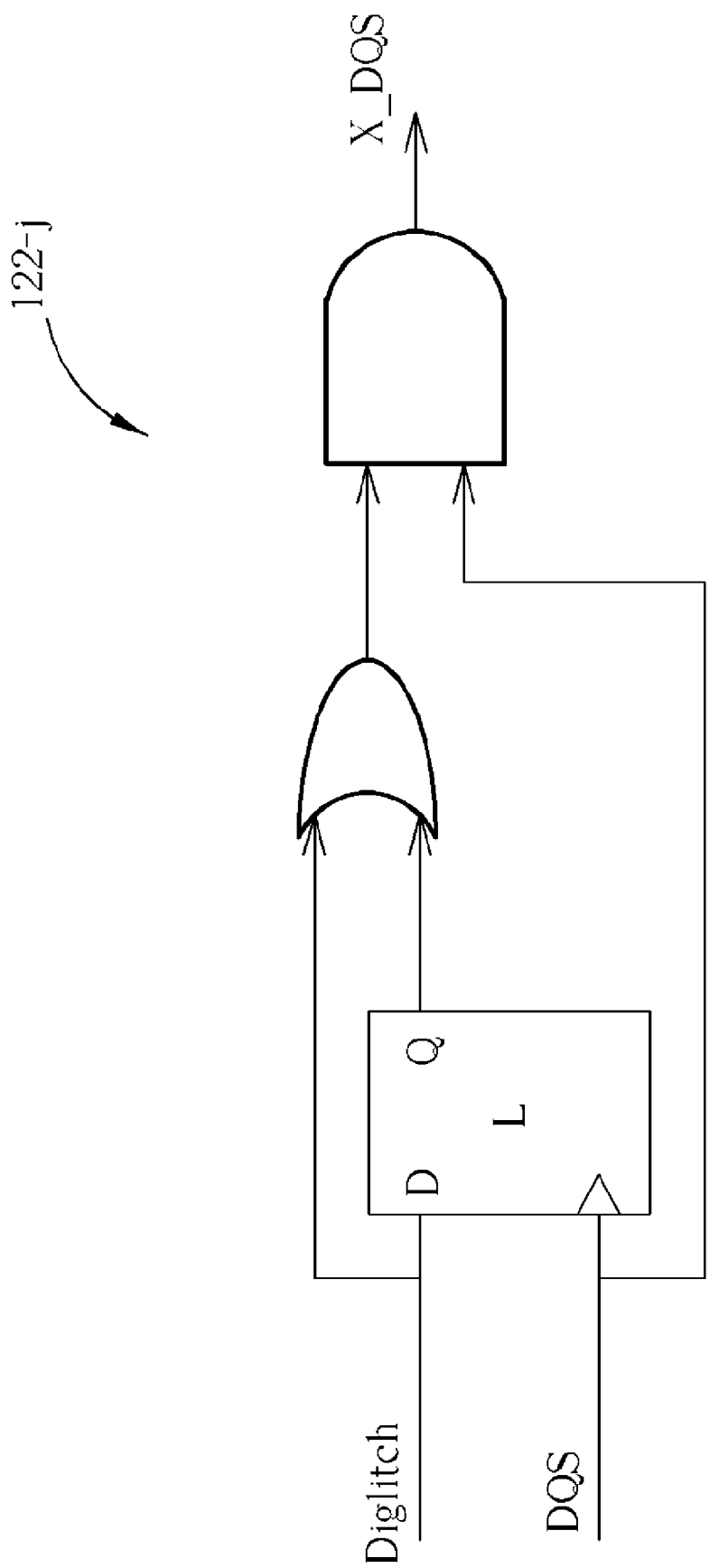
FIG. 5 illustrates implementation details of a clock gated cell (CG) within a window filter shown in FIG. 3 according to one embodiment of the present invention.

As shown in FIG. 2, the setting circuit 110 of this embodiment comprises a plurality of delay units, each of which comprises a delay cell having an adjustable delay amount such as $\Delta t_1$ or $\Delta t_2$. As shown in FIG. 3, the deglitch circuit 120 comprises a window filter 122 comprising a plurality of clock gated cells (CGs) 122-1, 122-2, and 122-3, and a plurality of counters 124-1, 124-2, and 124-3. As shown in FIG. 4, the determining circuit 130 comprises a comparison unit 132 and a control unit 134, where a reset signal RST controlled by the control unit 134 may reset the counters 124-1, 124-2, and 124-3 if needed. According to different implementation choices of this embodiment, the comparison unit 132 and the control unit 134 can be integrated into a hardware controller, or implemented by utilizing a processor executing a program code. In addition, FIG. 5 illustrates implementation details of one CG 122-$j$ ($j$=1, 2, or 3) within the window filter 120 shown in FIG. 3 according to one embodiment of the present invention.

Figure 6:
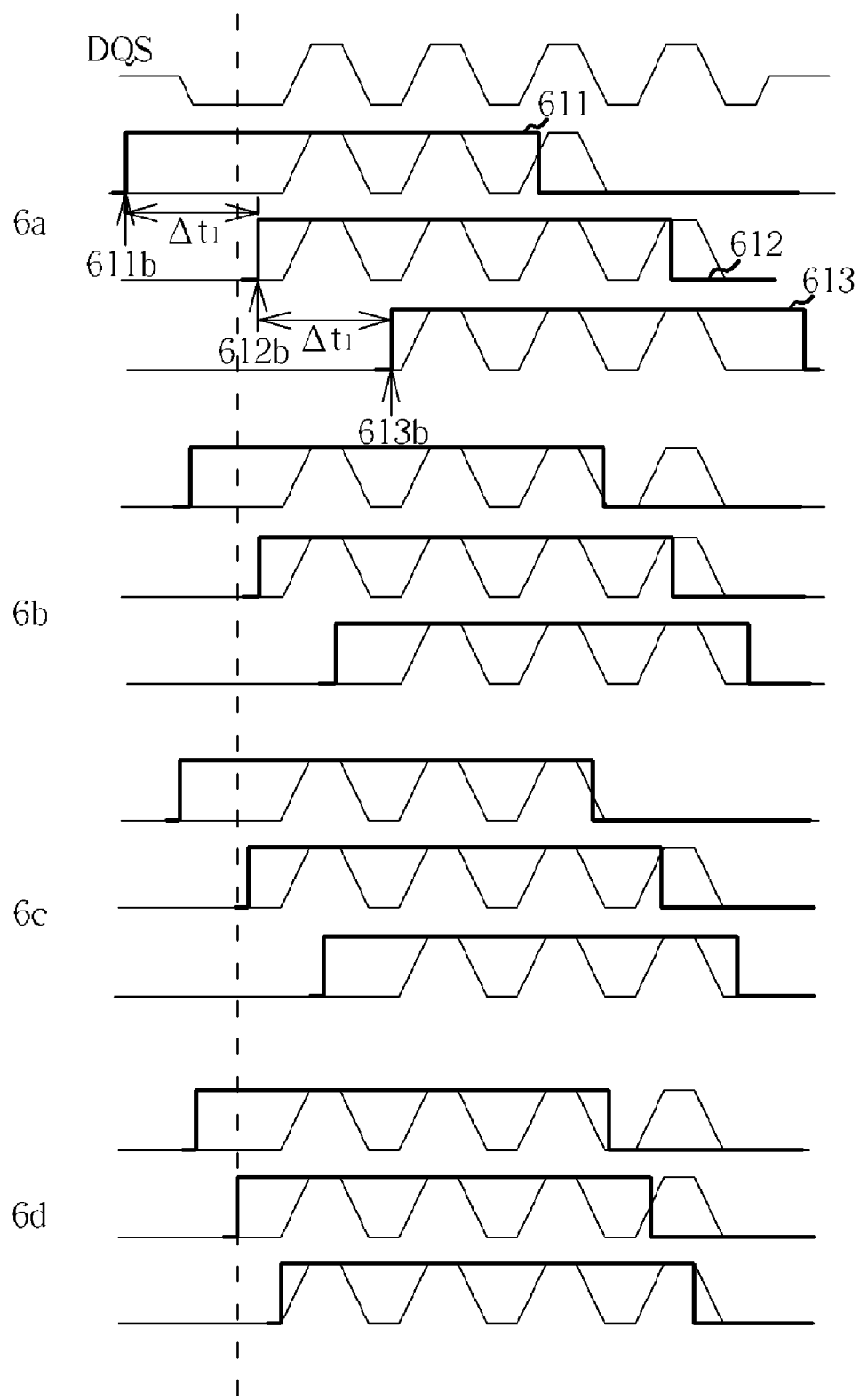
FIG. 6 is a timing chart illustrating how a memory control method dynamically adjusts deglitch windows according to one embodiment of the present invention.

FIG. 6 is a timing chart illustrating how a memory control method dynamically adjusts deglitch windows utilized by a memory control circuit receiving an original data strobe signal of a memory according to one embodiment of the present invention, where the memory of this embodiment is a DDR memory. The memory control method can be applied to the first embodiment, and can further be described as follows.

According to this embodiment, the aforementioned delay units such as the delay cells shown in FIG. 2 generate a plurality of deglitch window signals $DW_A$, $DW_B$, and $DW_C$ by delaying an original deglitch window signal DW, in order to set a plurality of deglitch windows such as three deglitch windows 611, 612, and 613, where a span period between the three deglitch windows 611, 612, and 613 set by the setting circuit 110 corresponds to the adjustable delay amount $\Delta t_1$, and a shift amount of the three deglitch windows 611, 612, and 613 set by the setting circuit 110 corresponds to the adjustable delay amount $\Delta t_2$. Please note that the deglitch windows 611, 612, and 613 respectively have different beginning time points 611$b$, 612$b$, and 613$b$ with respect to the original data strobe signal DQS.

According to the original data strobe signal DQS, the deglitch circuit 120 of this embodiment is capable of utilizing one of the plurality of deglitch windows to generate a deglitched data strobe signal (not shown) for accessing the memory mentioned above. More particularly, in this embodiment, the deglitch window utilized for generating the deglitched data strobe signal is a middle deglitch window such as the deglitch window 612. In addition, the deglitch circuit 120 is capable of deglitching according to the original data strobe signal DQS by utilizing the plurality of deglitch windows (e.g. the three deglitch windows 611, 612, and 613) in order to further derive a plurality of deglitch results.

In this embodiment, the window filter 122 filters trans-state noise of the original data strobe signal DQS, and further generates a plurality of filtered pulses by utilizing the CGs 122-1, 122-2, and 122-3 according to the deglitch window signals $DW_A$, $DW_B$, and $DW_C$ respectively, so the counters 124-1, 124-2, and 124-3 count respective numbers of filtered pulses corresponding to the three deglitch windows. Here, counter values of the counters 124-1, 124-2, and 124-3 are utilized for representing the deglitch results. More specifically, the counter values of the counters 124-1, 124-2, and 124-3 are representatives of the deglitch results.

Regarding the determining circuit 130 of this embodiment, the notations such as $Q_1$, $Q_2$, and $Q_3$ labeled at its input terminals for respectively receiving the representatives of the deglitch results from the deglitch circuit 120 can be utilized for representing the counter values. The determining circuit 130 is capable of utilizing the plurality of deglitch results, and more particularly, utilizing the representatives of the deglitch results (e.g. the three counter values $Q_1$, $Q_2$, and $Q_3$), to dynamically determine the adjustable delay amounts $\Delta t_1$ and $\Delta t_2$ for delaying the original deglitch window signal DW. As a result, the determining circuit 130 may determine latest values of the shift amount and the span period by updating the adjustable delay amounts $\Delta t_1$ and $\Delta t_2$, in order to adjust the shift amount of the three deglitch windows 611, 612, and 613 and the span period between the three deglitch windows 611, 612, and 613 during a series of auto-tracing processes such as those illustrated in FIG. 6$a$ through FIG. 6$d$.

For example, in an initial state shown in FIG. 6$a$, the beginning time point 612$b$ of the middle deglitch window 612 of the three deglitch windows 611, 612, and 613 is not centered at a middle time point of a preamble of the original data strobe signal DQS. Referring to FIG. 6$b$ though FIG. 6$d$, the deglitch windows respectively corresponding to the deglitch window signals $DW_A$, $DW_B$, and $DW_C$ are dynamically adjusted. As a result, in a steady state shown in FIG. 6$d$, the beginning time point of the deglitch window corresponding to the deglitch window signal $DW_B$ (i.e. the middle deglitch window) is kept centered at the middle time point of the preamble of the original data strobe signal DQS. In this embodiment, the middle time point is a center time point of the preamble as shown in FIG. 6.

According to this embodiment, the comparison unit 132 within the determining unit 130 compares the counter values $Q_1(i)$, $Q_2(i)$, and $Q_3(i)$ ($i$=1, 2, 3, . . . , etc.), so the control unit 134 within the determining unit 130 may update the adjustable delay amounts $\Delta t_1$ and $\Delta t_2$ according to comparison results from the comparison unit 132, in order to adjust the shift amount of the three deglitch windows corresponding to the deglitch window signals $DW_A$, $DW_B$, and $DW_C$, and to further adjust the span period between the three deglitch windows corresponding to the deglitch window signals $DW_A$, $DW_B$, and $DW_C$.

More specifically, in this embodiment, with $i_1$ representing a specific value of i, if a counter value $Q_1(i_1)$ corresponding to the deglitch window represented by the deglitch window signal $DW_A$ is not equal to a counter value $Q_2(i_1)$ corresponding to the deglitch window represented by the deglitch window signal $DW_B$, and if the counter value $Q_2(i_1)$ corresponding to the deglitch window represented by the deglitch window signal $DW_B$ is not equal to a counter value $Q_3(i_1)$ corresponding to the deglitch window represented by the deglitch window signal $DW_C$, i.e. the situation where $Q_1(i_1) \neq Q_2(i_1) \neq Q_3(i_1)$, the determining circuit 130 adjusts the span period of the three deglitch windows. As shown in FIG. 6, the span period in this embodiment is decreased.

In addition, with $i_2$ representing another specific value of i, if another counter value $Q_2(i_2)$ corresponding to the deglitch window represented by the deglitch window signal $DW_B$ is equal to another counter value corresponding to one deglitch window out of the deglitch window represented by the deglitch window signal $DW_A$ and the deglitch window represented by the deglitch window signal $DW_C$, and if the other counter value $Q_2(i_2)$ corresponding to the deglitch window represented by the deglitch window signal $DW_B$ is not equal to another counter value corresponding to the other deglitch window out of the deglitch window represented by the deglitch window signal $DW_A$ and the deglitch window represented by the deglitch window signal $DW_C$, i.e. the situation where $Q_1(i_2)=Q_2(i_2) \neq Q_3(i_2)$ or the situation where $Q_1(i_2) \neq Q_2(i_2)=Q_3(i_2)$, the determining circuit 130 adjusts the shift amount of the three deglitch windows. In this embodiment, in the situation where $Q_1(i_2)=Q_2(i_2) \neq Q_3(i_2)$, the three deglitch windows should be moved forward. Additionally, in the situation where $Q_1(i_2) \neq Q_2(i_2) = Q_3(i_2)$, the three deglitch windows should be moved backward.

By dynamically adjusting the three deglitch windows respectively represented by the deglitch window signals $DW_A$, $DW_B$, and $DW_C$ as mentioned above, a steady state such as that shown in FIG. 6d can be achieved. Thus, the memory control circuit 100 is capable of dynamically keeping the beginning time point of the deglitch window represented by the deglitch window signal $DW_B$ centered at the middle time point of the preamble of the original data strobe signal DQS (i.e. the center time point of the preamble in this embodiment). Additionally, the memory control circuit 100 is capable of dynamically keeping the beginning time point of the deglitch window represented by the deglitch window signal $DW_A$ centered at a beginning time point of the preamble, and further dynamically keeping the beginning time point of the deglitch window represented by the deglitch window signal $DW_C$ centered at an end time point of the preamble.

Figure 7:
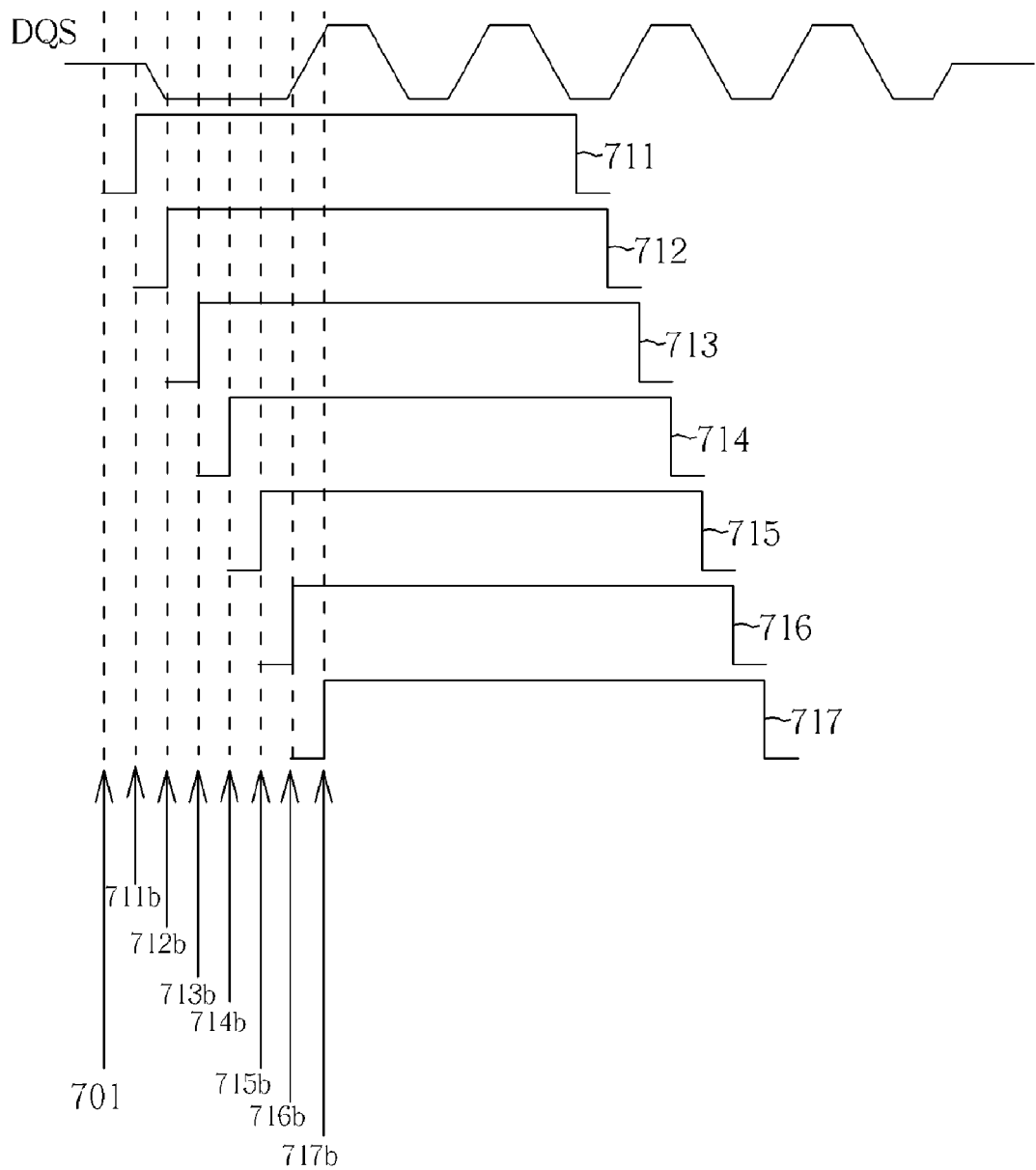
FIG. 7 is a timing chart illustrating how a memory control method dynamically adjusts deglitch windows according to another embodiment of the present invention.

FIG. 7 is a timing chart illustrating how a memory control method dynamically adjusts deglitch windows according to another embodiment of the present invention, where the embodiment shown in FIG. 7 is a variation of the embodiment shown in FIG. 6.

According to this embodiment, a plurality of deglitch windows 711, 712, . . . , and 717 having respective beginning time points 711b, 712b, . . . , and 717b are provided by delaying the original deglitch window signal DW, which has a beginning time point 701 in this embodiment. The deglitch results (or the representatives thereof) can be derived by utilizing the deglitch windows 711, 712, . . . , and 717, respectively. Thus, edge detection can be performed according to the deglitch results. By dynamically determining a proper delay amount for delaying the original deglitch window signal DW according to the edge detection, in a steady state the beginning time point of the deglitch window corresponding to the determined delay amount can be kept centered at the middle time point of the preamble of the original data strobe signal DQS, such as the center time point of the preamble. In the situation shown in FIG. 7, the deglitch window 714 is the one that is selected out of the deglitch windows 711, 712, . . . , and 717 since the beginning time point 714b is centered at the center time point of the preamble.

In contrast to the prior art, the memory control circuits and methods of the present invention are capable of dynamically adjusting deglitch windows, in order to achieve the best performance of memory control.

It is another advantage of the claimed invention that, in the situation where the phases of the original deglitch window signal DW and/or the DQS signal fluctuate due to interference from noise or internal/external environmental reasons such as temperature variation or the supply voltage drops mentioned above, the memory control circuits and methods of the present invention can still achieve the best performance of memory control.

Those skilled in the art will readily observe that numerous modifications and alterations of the device and method may be made while retaining the teachings of the invention.

What is claimed is:

1. A memory control circuit receiving an original data strobe signal of a memory, the memory control circuit comprising:
    a setting circuit for setting at least three deglitch windows respectively having different beginning time points;
    a deglitch circuit, coupled to the setting circuit, for deglitching according to the original data strobe signal by utilizing the at least three deglitch windows to derive at least three deglitch results; and
    a determining circuit, coupled to the deglitch circuit and the setting circuit, for determining a latest value of a span period between the at least three deglitch windows set by the setting circuit according to the at least three deglitch results, in order to adjust the span period of the at least three deglitch windows;
    wherein according to the original data strobe signal, the deglitch circuit utilizes one of the at least three deglitch windows to generate a deglitched data strobe signal for accessing the memory.

2. The memory control circuit of claim 1, wherein the original data strobe signal is a DQS signal.

3. The memory control circuit of claim 1, wherein the setting circuit comprises:
    a plurality of delay units for delaying an original deglitch window signal to set the three deglitch windows;
    wherein the span period corresponds to a delay amount of one of the delay units.

4. The memory control circuit of claim 1, wherein the determining circuit further determines a latest value of a shift amount of the three deglitch windows set by the setting circuit according to the three deglitch results in order to adjust the shift amount of the three deglitch windows.

5. The memory control circuit of claim 1, wherein the deglitch circuit comprises:
    a window filter for filtering trans-state noise of the original data strobe signal; and
    a plurality of counters, coupled to the window filter, for counting respective numbers of filtered pulses corresponding to the three deglitch windows, wherein counter values of the counters are utilized for representing the deglitch results.

6. The memory control circuit of claim 5, wherein the three deglitch windows comprise a first deglitch window, a second deglitch window, and a third deglitch window respectively having their beginning time points set in order; and if a counter value corresponding to the first deglitch window is not equal to a counter value corresponding to the second deglitch window, and if the counter value corresponding to the second deglitch window is not equal to a counter value corresponding to the third deglitch window, the determining circuit adjusts the span period of the three deglitch windows.

7. The memory control circuit of claim 6, wherein if another counter value corresponding to the second deglitch window is equal to another counter value corresponding to one deglitch window out of the first deglitch window and the third deglitch window, and if the other counter value corresponding to the second deglitch window is not equal to another counter value corresponding to the other deglitch window out of the first deglitch window and the third deglitch window, the determining circuit adjusts a shift amount of the three deglitch windows.

8. The memory control circuit of claim 1, wherein the three deglitch windows comprise a first deglitch window, a second deglitch window, and a third deglitch window respectively having their beginning time points set in order; and the memory control circuit is capable of dynamically keeping the beginning time point of the second deglitch window centered at a middle time point of a preamble of the original data strobe signal.

9. The memory control circuit of claim 8, wherein the memory control circuit is capable of dynamically keeping the beginning time point of the first deglitch window centered at a beginning time point of the preamble, and further dynamically keeping the beginning time point of the third deglitch window centered at an end time point of the preamble.

10. The memory control circuit of claim 1, wherein the memory is a double data rate (DDR) memory.

11. A memory control method for adjusting deglitch windows utilized by a memory control circuit receiving an original data strobe signal of a memory, the memory control method comprising:

deglitching according to the original data strobe signal by utilizing a plurality of deglitch windows that are set by delaying an original deglitch window signal, in order to derive a plurality of deglitch results, wherein the deglitch windows have different beginning time points; and utilizing the deglitch results to dynamically determine a delay amount for delaying the original deglitch window signal, wherein the beginning time point of one of the deglitch windows is kept centered at a middle time point of a preamble of the original data strobe signal.

12. The memory control method of claim 11, wherein the original data strobe signal is a DQS signal.

13. The memory control method of claim 11, wherein the plurality of deglitch windows comprises at least three deglitch windows comprising a first deglitch window, a second deglitch window, and a third deglitch window respectively having their beginning time points set in order; and the second deglitch window is the deglitch window whose beginning time point is kept centered at the middle time point of the preamble of the original data strobe signal.

14. The memory control method of claim 13, wherein the step of utilizing the deglitch results to dynamically determine the delay amount for delaying the original deglitch window signal further comprises:

determining a latest value of a span period between the three deglitch windows according to the deglitch results to adjust the span period of the three deglitch windows, wherein the span period corresponds to the delay amount;

wherein the step of deglitching according to the original data strobe signal by utilizing the plurality of deglitch windows further comprises:

according to the original data strobe signal, utilizing one of the three deglitch windows to generate a deglitched data strobe signal for accessing the memory.

15. The memory control method of claim 14, wherein the step of utilizing the deglitch results to dynamically determine the delay amount for delaying the original deglitch window signal further comprises:

utilizing the deglitch results to dynamically determine another delay amount for delaying the original deglitch window signal; and determining a latest value of a shift amount of the deglitch windows according to the deglitch results to adjust the shift amount of the deglitch windows, wherein the shift amount corresponds to the other delay amount.

16. The memory control method of claim 14, further comprising:

delaying the original deglitch window signal by utilizing a plurality of delay units to set the three deglitch windows; wherein the three deglitch windows respectively correspond to delay amounts of the delay units.

17. The memory control method of claim 14, wherein the step of deglitching according to the original data strobe signal by utilizing the plurality of deglitch windows further comprises:

utilizing a plurality of counters to count respective numbers of filtered pulses corresponding to the three deglitch windows, wherein counter values of the counters are utilized for representing the deglitch results; and if a counter value corresponding to the first deglitch window is not equal to a counter value corresponding to the second deglitch window, and if the counter value corresponding to the second deglitch window is not equal to a counter value corresponding to the third deglitch window, adjusting the span period of the three deglitch windows.

18. The memory control method of claim 17, wherein the step of deglitching according to the original data strobe signal by utilizing the plurality of deglitch windows further comprises:

if another counter value corresponding to the second deglitch window is equal to another counter value corresponding to one deglitch window out of the first deglitch window and the third deglitch window, and if the other counter value corresponding to the second deglitch window is not equal to another counter value corresponding to the other deglitch window out of the first deglitch window and the third deglitch window, adjusting a shift amount of the three deglitch windows.

19. The memory control method of claim 11, wherein the step of utilizing the deglitch results to dynamically determine the delay amount for delaying the original deglitch window signal further comprises:

performing edge detection according to the deglitch results; and dynamically determining the delay amount for delaying the original deglitch window signal according to the edge detection, wherein the beginning time point of the deglitch window corresponding to the determined delay amount is kept centered at the middle time point of the preamble of the original data strobe signal.

20. The memory control method of claim 11, wherein the memory is a double data rate (DDR) memory.

* * * * *